(12) United States Patent
Duclos et al.

(10) Patent No.: US 6,380,565 B1
(45) Date of Patent: Apr. 30, 2002

(54) BIDIRECTIONAL SWITCH WITH INCREASED SWITCHING BREAKDOWN VOLTAGE

(75) Inventors: Franck Duclos, Tours; Jean-Michel Simonnet, Veretz; Olivier Ladiray, Montlouis sur Loire, all of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/634,077

(22) Filed: Aug. 8, 2000

(30) Foreign Application Priority Data

Aug. 9, 1999 (FR) .............................. 99 10413

(51) Int. Cl.[7] ............................................ H01L 29/747
(52) U.S. Cl. ...................... 257/107; 257/123; 257/125; 257/135
(58) Field of Search ............................ 257/37, 38, 39, 257/107, 123, 125

(56) References Cited

U.S. PATENT DOCUMENTS 3,409,810 A * 11/1968 Matzen ...................... 317/235
4,613,884 A * 9/1986 Angerstein et al. ............ 357/39
4,755,862 A    7/1988 Noguier et al. ................ 357/39
4,994,884 A * 2/1991 Kato et al. ..................... 357/39

OTHER PUBLICATIONS

French Search Report from French patent application 99 10413, filed Aug. 9, 2000.

* cited by examiner

*Primary Examiner*—Charles Bowers
*Assistant Examiner*—Venkatesha S. Bhagawan
(74) *Attorney, Agent, or Firm*—Wolf, Greenfield & Sacks, P.C.; James H. Morris

(57) ABSTRACT

A monolithic bidirectional switch formed in a semiconductor substrate of a first conductivity type having a front surface and a rear surface, including a first main vertical thyristor, the rear surface layer of which is of the second conductivity type, a second main vertical thyristor, the rear surface layer of which is of the first conductivity type. A structure for triggering each of the first and second main thyristors is arranged to face regions mutually distant from the two main thyristors, the neighboring portions of which correspond to a region for which, for the first main thyristor, a short-circuit area between cathode and cathode gate is formed.

4 Claims, 5 Drawing Sheets

BIDIRECTIONAL SWITCH WITH INCREASED SWITCHING BREAKDOWN VOLTAGE

BACKGROUND OF THE INVENTION

1. Field of the Invention

The present invention relates to making, in monolithic form, bidirectional switches of medium power.

2. Discussion of the Related Art

Conventional static bidirectional switches are triacs. A triac corresponds to the antiparallel association of two thyristors. It can thus be directly connected in an A.C. network, for example, the mains. The gate of a conventional triac corresponds to the cathode gate of one, at least, of the two thyristors forming it and is referenced on the electrode located on the front surface of this triac, that is, the surface that includes the gate terminal, while the other triac surface is typically connected to a heat sink or to the ground.

Bidirectional switches of the type described in European patent application No. 0 817 277, the triggering of which is ensured by applying a voltage between a control electrode located on the front surface of the component and a main electrode located on the opposite surface of the component, will more specifically be considered hereafter.

FIG. 1 shows an equivalent schematic diagram of such a bidirectional switch. A control electrode G of the bidirectional switch is connected to the emitter of a bipolar transistor T, the collector of which is connected to the anode gates of first and second thyristors Th1 and Th2 placed in antiparallel between two terminals A1 and A2. Terminal A1 corresponds to the anode of thyristor Th1 and to the cathode of thyristor Th2. Terminal A1 is also connected to the base of transistor T. Terminal A2 corresponds to the anode of thyristor Th2 and to the cathode of thyristor Th1.

FIG. 2A is a simplified cross-section view of an example of a monolithic embodiment of the bidirectional switch described in relation with FIG. 1. Transistor T is formed in the left-hand portion of the drawing, thyristor Th1 at the center, and thyristor Th2 to the right thereof. As will be seen hereafter, this does not correspond to the effective arrangement of the various components, an example of which will be given in relation with the top view of FIG. 2B, but is only intended for explaining the operation of the structure.

The structure of FIG. 2A is formed from an N-type lightly doped semiconductor substrate 1. The anode of thyristor Th1 corresponds to a P-type layer 2 that is formed on the rear surface side of substrate 1. Its cathode corresponds to an N-type region 3 formed on the front surface side in a P-type well 4. The anode of thyristor Th2 corresponds to a P-type well 5 formed on the front surface side and its cathode corresponds to an N-type region 6 formed on the rear surface side in layer 2. The periphery of the structure is formed of a heavily-doped P-type layer 7 extending from the front surface to P-type layer 2. Conventionally, region 7 is obtained by drive-in from the two substrate surfaces. The rear surface is coated with a metallization M1 corresponding to first terminal A1 of the bidirectional switch. The upper surfaces of regions 3 and 5 are coated with a second metallization M2 corresponding to second terminal A2 of the bidirectional switch. An N-type region 8 is formed, on the front surface side, in a P-type well 9 in contact with peripheral region 7. The surface of region 8 is contacted by a metallization M3 connected to control terminal G of the bidirectional switch. A metallization M4 may be formed on the upper surface of peripheral region 7. Metallization M4 is connected to no external terminal. As an alternative, well 9 may be separated from peripheral region 7 and electrically connected thereto via metallization M4.

The operation of this bidirectional switch is the following.

When terminal A2 is negative with respect to terminal A1, thyristor Th1 is capable of being on. If a sufficiently negative voltage with respect to metallization M1 is applied to gate G, the base-emitter junction of transistor T is forward biased and this transistor turns on. A vertical current ic shown in dotted lines in FIG. 2A thus flows from metallization M1, through the forward junction between layer 2 and substrate 1, then into regions 1, 9 and 8 corresponding to transistor T. Carriers are thus generated at the level of the junction between substrate 1 and well 9 near the junction between substrate 1 and well 4, and thyristor Th1 is turned on. It can also be considered that an auxiliary vertical NPNP thyristor Tha including regions 8-9-1-2, region 9 of which forms the cathode gate region, has been triggered.

When terminal A2 is positive with respect to terminal A1, thyristor Th2 is capable of being on. Applying a negative voltage on terminal G turns on transistor T. The carriers present in the vicinity of the junction between substrate 1 and layer 2 turn on thyristor Th2, as will be better understood by referring to the simplified top view of FIG. 2B in which it can be seen that the region corresponding to transistor T neighbors a portion of each of thyristors Th1 and Th2.

As can also be seen in the top view of FIG. 2B, triggering transistor T (that forms a portion of auxiliary thyristor Tha) is arranged to face a portion of vertical thyristor Th1 and a portion of vertical thyristor Th2. More specifically, thyristor Th1 must be very sensitive in the vicinity of its triggering area, that is, it must include no short-circuit region between its cathode and its cathode gate. Thus, metallization M2, not shown in FIG. 2B, which is in contact with region 3 and well 5, is in contact with region 4 in a region opposite to the triggering area only.

A disadvantage of the structure shown in FIG. 2 is that it has a poor switching breakdown voltage characteristic in the presence of an inductive load, that is, when the conduction of the bidirectional switch is desired to be interrupted, said switch, and more specifically thyristor Th1, risks turning back on while its control electrode is no longer activated.

SUMMARY OF THE INVENTION

An object of the present invention is to provide a novel embodiment, in monolithic form, of a bidirectional switch of the above mentioned type that has a better switching breakdown voltage, especially on an inductive load.

To achieve this and other objects, the present invention provides a monolithic bidirectional switch formed in a semiconductor substrate of a first conductivity type having a front surface and a rear surface, including a first main vertical thyristor, the rear surface layer of which is of the second conductivity type, a second main vertical thyristor, the rear surface layer of which is of the first conductivity type, and structures for triggering each of the first and second main thyristors arranged to face regions mutually distant from the two main thyristors, the neighboring portions of which correspond to a region for which, for the first main thyristor, a short-circuit area between cathode and cathode gate is formed.

According to an embodiment of the present invention, the bidirectional switch includes a first auxiliary vertical thyristor, the rear surface layer of which is of the second conductivity type and is common with that of the first main thyristor, a second auxiliary vertical thyristor, the rear surface layer of which is of the second conductivity type and is common with that of the first thyristor, the main upper surface terminals of the first and second auxiliary thyristors forming a same control terminal, a peripheral region of the second conductivity type connecting, in particular, the rear surface layer of the auxiliary thyristors to the gate layers of these auxiliary thyristors located on the other side of the substrate, a first rear surface metallization, a second front surface metallization connecting the front surface regions of the first and second thyristors.

According to an embodiment of the present invention, the bidirectional switch includes an additional region that isolates the rear surface of the first auxiliary thyristor from the first metallization.

According to an embodiment of the present invention, the bidirectional switch includes, in the substrate between the upper surface of each of the main thyristors and the upper surface of each of the auxiliary thyristors, a region of the first conductivity type more heavily doped than the substrate, connected to the other region.

The foregoing objects, features and advantages of the present invention, will be discussed in detail in the following non-limiting description of specific embodiments in connection with the accompanying drawings.

DETAILED DESCRIPTION

For clarity, the same elements have been designated by the same references in the different drawings. Further, as usual in the representation of integrated circuits, FIGS. 2 to 5 are not drawn to scale.

Figure 1:
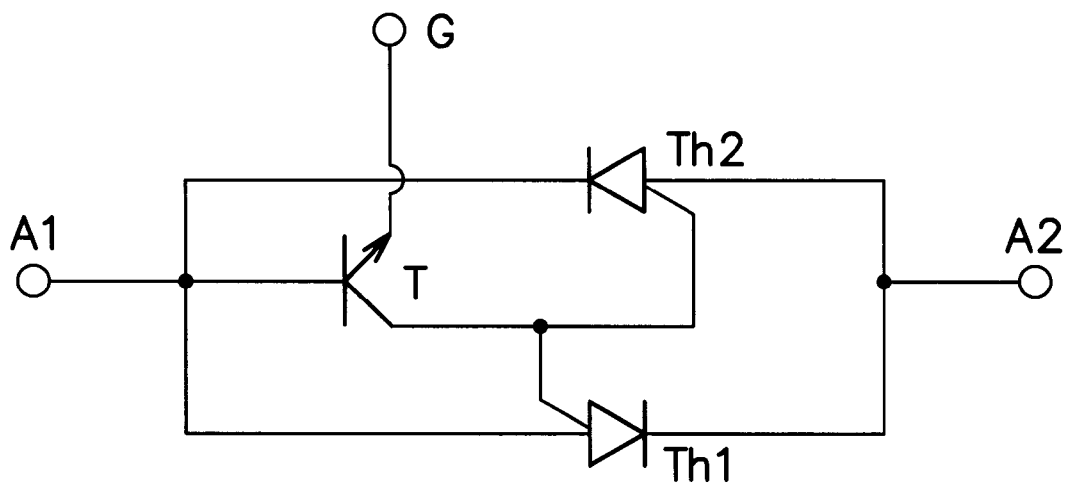
FIG. 1 is a schematic diagram of a conventional bidirectional switch.
Figure 2A:
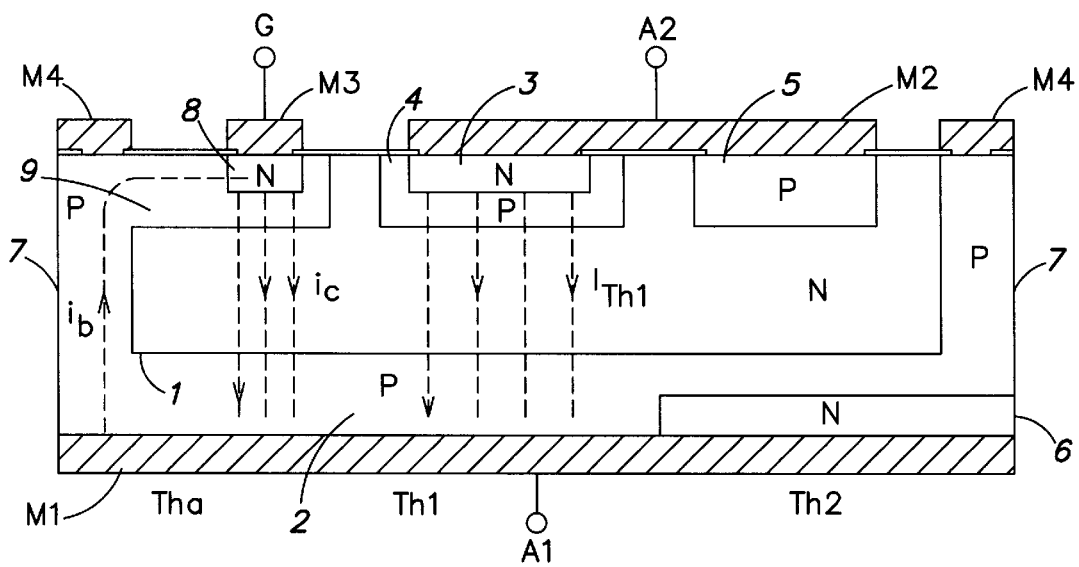
FIGS. 2A and 2B respectively show a cross-section view and a top view of a conventional embodiment of the bidirectional switch of FIG. 1.
Figure 2B:
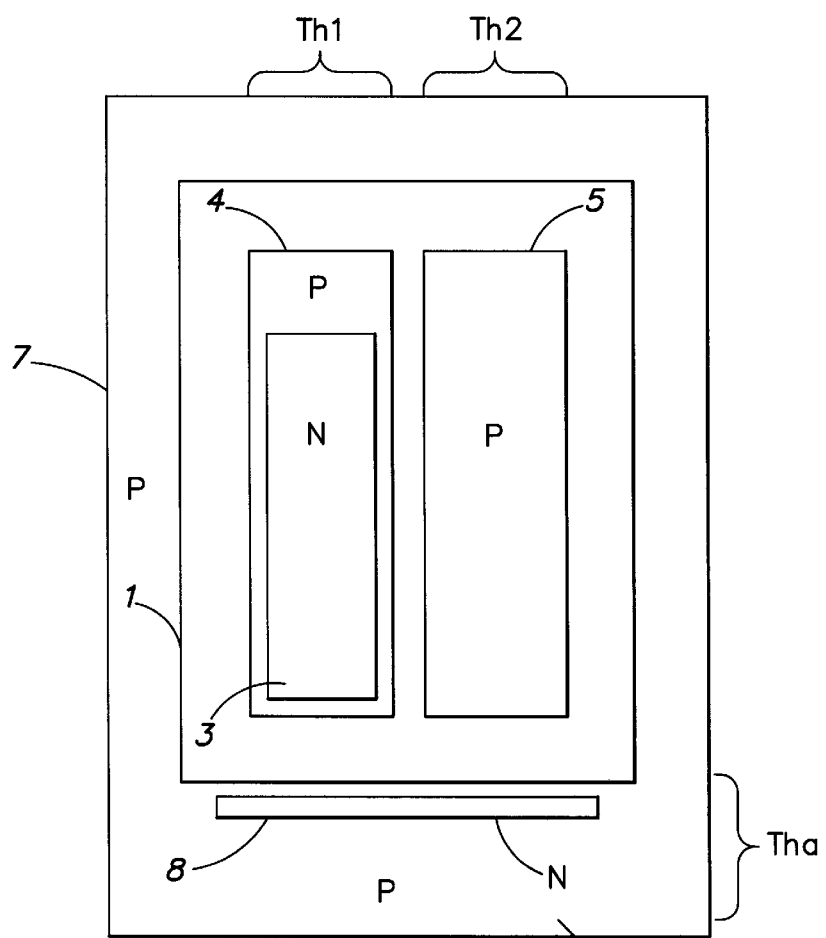
Figure 3A:
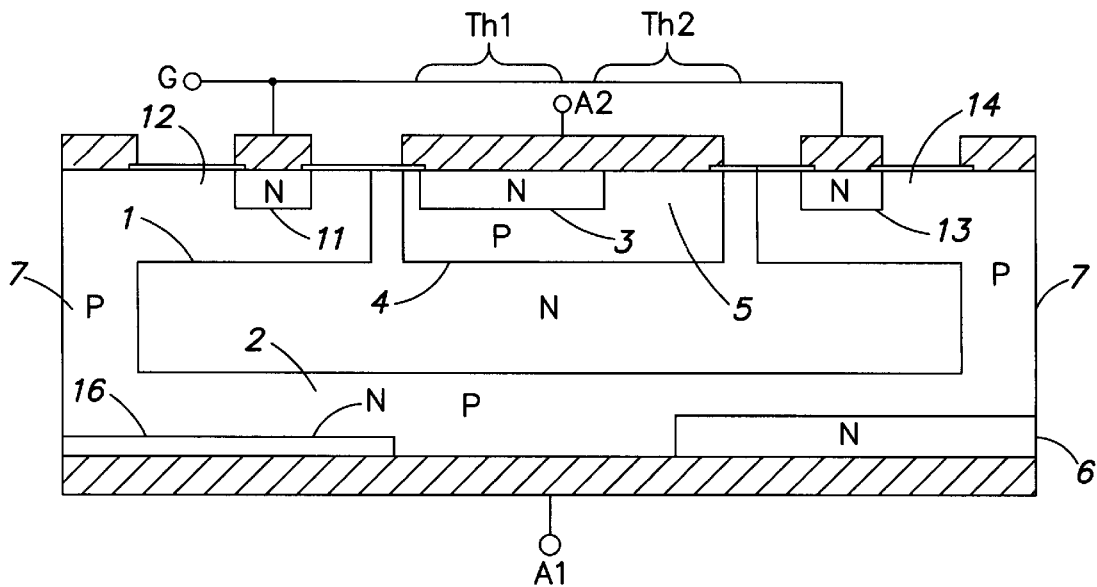
FIGS. 3A and 3B respectively show a cross-section view and a top view of an embodiment of a bidirectional switch according to the present invention.

As shown in the cross-section view of FIG. 3A, a bidirectional switch according to the present invention includes, like that of FIG. 2A, a main switch comprised of thyristors Th1 and Th2. Thyristor Th1 includes, from the upper surface to the lower surface, an N-type region 3, a P-type well 4, N-type substrate 1, and a P-type layer 2. Thyristor Th2 includes from the upper surface to the lower surface a P-type well 5, substrate 1, layer 2, and an N-type region 6. In this embodiment, the two thyristors share on the upper surface side a same P region that forms the anode layer of thyristor Th2 and the cathode gate layer of thyristor Th1. It should be noted that a connection could have been provided in FIG. 2B between the upper portions of regions 4 and 5, given that there exists a short-circuit through metallization M2 between cathode region 3 of thyristor Th1 and the upper portion of anode gate region 4 and that metallization M2 is also in contact with anode region 5 of thyristor Th2.

Figure 3B:
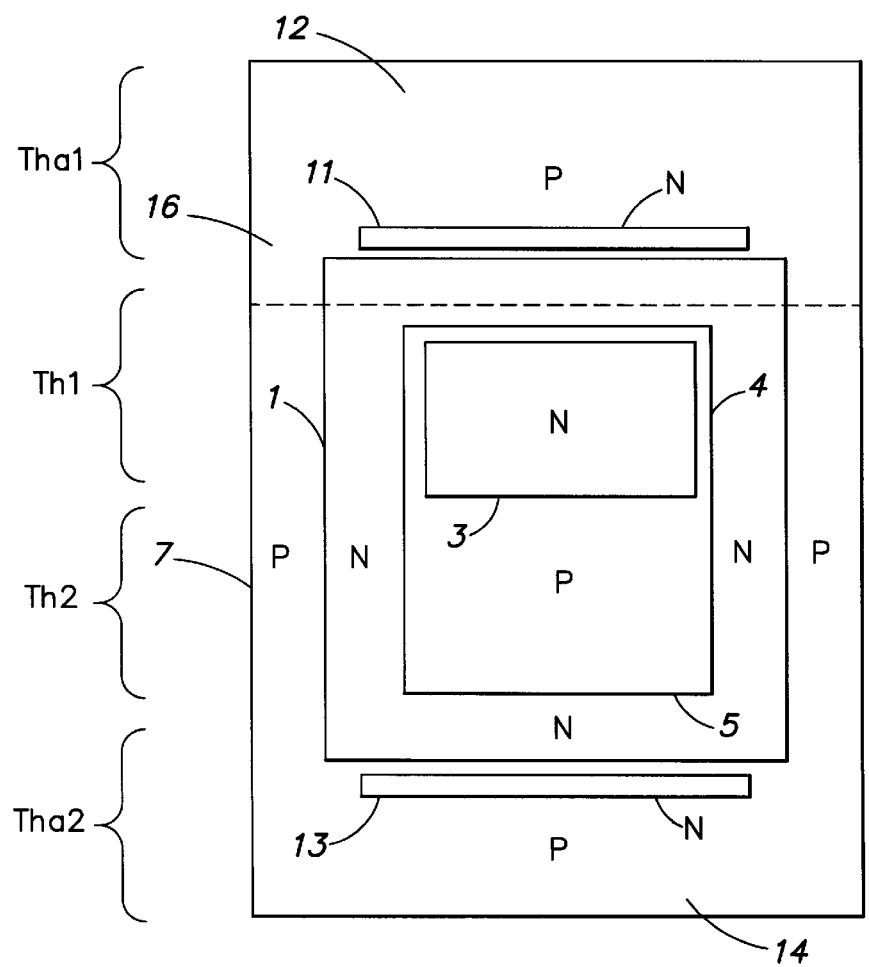

A significant difference between the present invention and the prior embodiment of a bidirectional switch described in relation with FIGS. 2A and 2B can be better made out from the top view of FIG. 3B. Instead of providing a single auxiliary triggering thyristor on one side of the structure (in the left-hand portion of the top view of FIG. 2A and in the low portion of the top view of FIG. 2B), the present invention provides two triggering structures, each of which is intended for triggering one of the two thyristors forming the bidirectional switch. The triggering structure of thyristor Th1 includes an N-type region 11 arranged in a P-type well 12 that is connected to P-type layer 2 of the rear surface by a drive-in 7. Region 11, well 12, substrate 1, and layer 2 altogether form a first auxiliary vertical thyristor Tha1. The triggering region of thyristor Th2 includes, on the upper surface side of the structure an N-type region 13 formed in a P-type well 14, well 14 joining drive-in region 7 that, preferably, extends over the entire component periphery. Region 13, well 14, substrate 1, and layer 2 altogether form a second auxiliary vertical thyristor Tha2.

Further, the present invention optionally, but preferentially, provides that an N-type region 16 is arranged on the rear surface side of the structure substantially under thyristor Tha1 for triggering thyristor Th1. In the top view of FIG. 3B, region 16 substantially extends from the upper surface of the drawing to above P well 4.

The structure of FIGS. 3A and 3B appears to have a much better switching breakdown voltage on an inductive load than that of FIGS. 2A–2B. The applicant attributes this to the fact that, in the case of the structure of FIGS. 2A–2B, at the time when thyristor Th2 turns off, charges are stored in the areas corresponding to thyristor Th2 and especially near the region of thyristor Th1 close to triggering region 8, this region of thyristor Th1 being particularly sensitive to a triggering. Conversely, in the case of the structure of FIGS. 3A–3B, at the time when the current becomes zero in thyristor Th2, charges are of course also stored in the areas corresponding to this thyristor. But the only region where thyristor Th2 and thyristor Th1 are neighbors is the lower portion of thyristor Th1 in FIG. 3B, that is, the portion of this thyristor in which there is a short-circuit between the cathode and the cathode gate. This region is particularly insensitive and thyristor Th1 is then not likely to turn back on.

At turning-on, it should be noted that, when a voltage is applied on terminal G, adapted to turning on one or the other of thyristors Th1 and Th2, a pre-triggering current will flow between electrode A1 and terminal G, this current being formed of a base-emitter current 12-11 of the control transistor (T1) of thyristor Th1 and a base-emitter current 14-13 of the control transistor (T2) of thyristor Th2. When, for example, thyristor Th1 is desired to be triggered, this means that a small loss occurs in transistor T2 as transistor T1 is desired to be turned on.

Figure 4A:
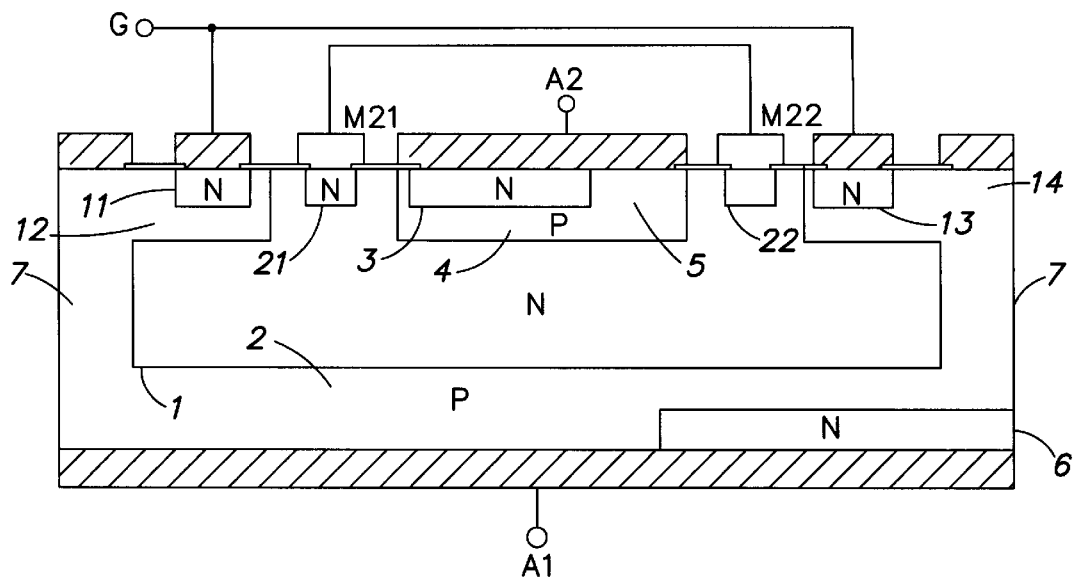
FIGS. 4A and 4B respectively show a cross-section view and a top view of another embodiment of a bidirectional switch according to the present invention.
Figure 4B:
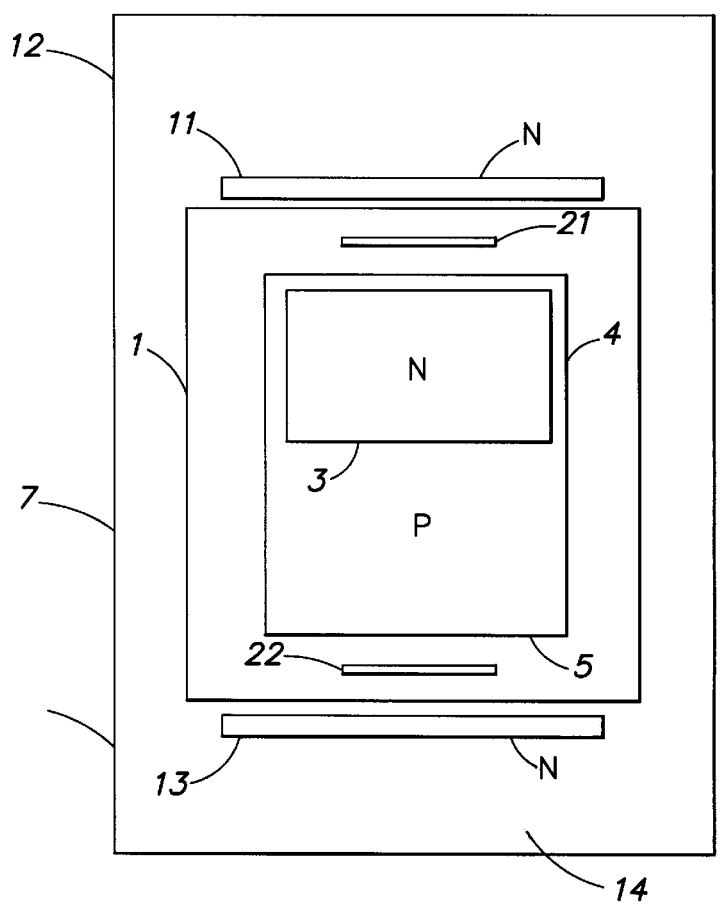

The embodiment of FIGS. 4A–4B enables reducing this loss that, anyway, is not significant.

In the structure of FIGS. 4A–4B, an N-type region 21 has been added with respect to the structure of FIGS. 3A–3B between P well 4-5 and P well 12 and an N-type region 22 has been added between P well 4-5 and P well 14. As can be seen from FIG. 4B, N regions 21 and 22 with a very high doping level do not form a channel stop region, given that they do not completely surround well 4-5. Regions 21 and 22 are contacted by metallizations M21 and M22 connected to each other. Thus, when the structure is biased between terminals A1 and A2 to turn on the transistor corresponding to one of the thyristors, for example, thyristor Th1, the triggering current lost in the opposite transistor is recovered by the opposite N+region (22) and is reinjected towards the N+region (21) close to the triggering area of thyristor Th1 and takes part in its turning-on. The opposite occurs when thyristor Th2 is desired to be controlled.

According to another alternative of the present invention, the embodiment of FIGS. 4A and 4B may be maintained while eliminating region 13. This does not substantially modify the turning-on of the transistor driving thyristor Th1. However, when the biasing is such that thyristor Th2 is likely to be turned on, it should be noted that the electrons injected by the transistor driving thyristor Th1 are reinjected by N+region 22 to enable a triggering of thyristor Th2. This arrangement in fact slightly alters the triggering performances of thyristor Th2 but enables reducing the chip size without modifying the active area of the thyristors.

Figure 5A:
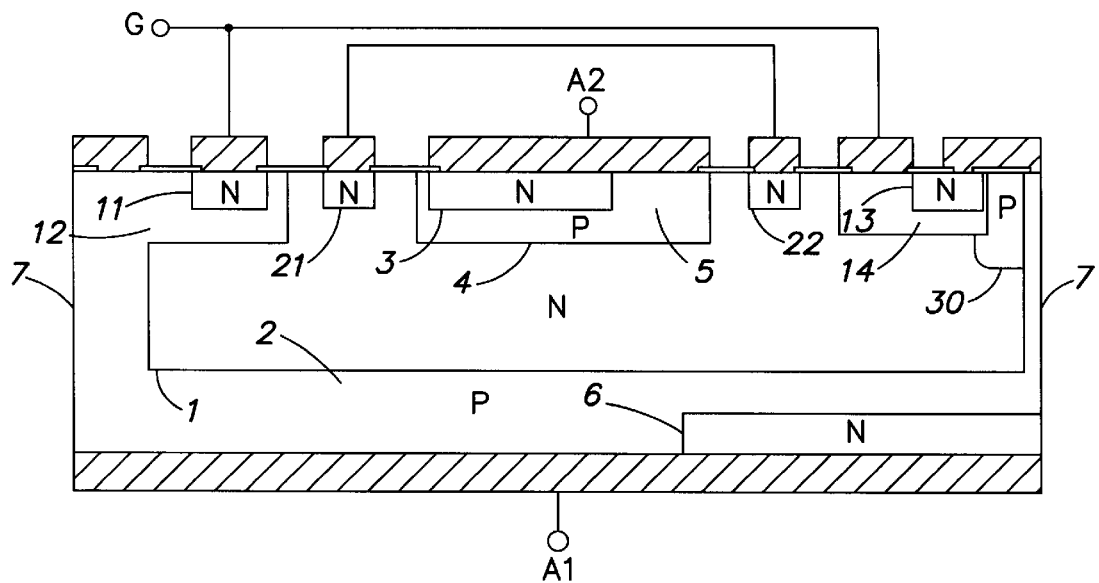
FIGS. 5A and 5B respectively show a cross-section view and a top view of another embodiment of a bidirectional switch according to the present invention.
Figure 5B:
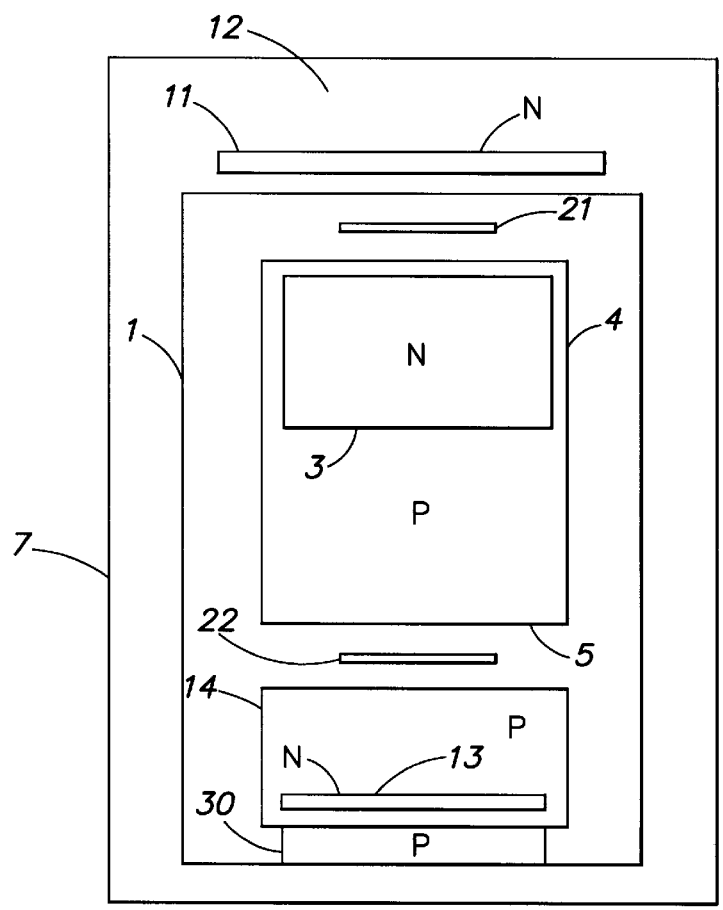

FIGS. 5A and 5B respectively show a cross-section view and a top view of another embodiment of a bidirectional switch according to the present invention, adapted to receive a positive or negative control signal on terminal G.

The structure of FIGS. 5A and 5B is similar to that of FIGS. 4A and 4B, except that:

well 14 is no longer in contact with isolating wall 7 and is separated therefrom by a lightly-doped P-type region 30;

the gate connection is as previously connected to region 11 of the first drive transistor. However, it is no longer connected to N+-type region 13 of the second drive transistor, but to well region 14;

region 13 is connected by a metallization to the upper surface of isolating wall 7.

With such a structure, drive transistor T1 located to the left of the cross-section view of FIG. 5A and at the top of the top view of FIG. 5B, operates to trigger the system when the gate terminal is negative with respect to terminal A1, whether terminal A2 is positive or negative with respect to terminal A1; and the drive transistor located to the right of the cross-section view of FIG. 5A and at the bottom of the top view of FIG. 5B is used for the triggering with a positive control terminal G with respect to terminal A1, whether terminal A2 is positive or negative with respect to terminal A1.

Of course, the present invention is likely to have various alterations, modifications, and improvements which will readily occur to those skilled in the art. In particular, various alternatives of the two main thyristors may be devised. A fundamental feature of the present invention is that the preferential triggering areas of each of the thyristors are opposite and that the adjacent region of the two thyristors is a region of small turn-on sensitivity.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A monolithic bidirectional switch formed in a semiconductor substrate of a first conductivity type having a front surface and a rear surface, including a first main vertical thyristor, the rear surface layer of which is of the second conductivity type, a second main vertical thyristor, the rear surface layer of which is of the first conductivity type, and a triggering structure for each of the first and second main thyristors, wherein said triggering structures are arranged to face regions mutually distant from the two main thyristors, the neighboring portions of which correspond to a region for which, for the first main thyristor, a short-circuit area between cathode and cathode gate is formed.

2. The bidirectional switch of claim 1, including:

a first auxiliary vertical thyristor, the rear surface layer of which is of the second conductivity type and is common with that of the first main thyristor, a second auxiliary vertical thyristor, the rear surface layer of which is of the second conductivity type and is common with that of the first thyristor, the main upper surface terminals of the first and second auxiliary thyristors forming a same control terminal, a peripheral region of the second conductivity type connecting, in particular, the rear surface layer of the auxiliary thyristors to the gate layers of these auxiliary thyristors located on the other side of the substrate, a first rear surface metallization, a second front surface metallization connecting the front surface regions of the first and second thyristors.

3. The bidirectional switch of claim 2, including an additional region that isolates the rear surface of the first auxiliary thyristor from the first metallization.

4. The bidirectional switch of claim 2, including, in the substrate between the upper surface of each of the main thyristors and the upper surface of each of the auxiliary thyristors, a region of the first conductivity type more heavily doped than the substrate, connected to the other region.

* * * * *